(12) United States Patent
Glukhoy et al.

(10) Patent No.: US 7,967,945 B2
(45) Date of Patent: Jun. 28, 2011

(54) RF ANTENNA ASSEMBLY FOR TREATMENT OF INNER SURFACES OF TUBES WITH INDUCTIVELY COUPLED PLASMA

(76) Inventors: Yuri Glukhoy, San Francisco, CA (US); Tatiana Kerzhner, San Francisco, CA (US); Anna Ryaboy, San Francisco, CA (US)

( * ) Notice: Subject to any disclaimer, the term of this patent is extended or adjusted under 35 U.S.C. 154(b) by 456 days.

(21) Appl. No.: 12/156,148

(22) Filed: May 30, 2008

(65) Prior Publication Data
US 2009/0297730 A1    Dec. 3, 2009

(51) Int. Cl.
*H01L 21/306*      (2006.01)
*C23C 16/00*      (2006.01)
(52) U.S. Cl. .......... 156/345.48; 118/723 I; 118/723 AN
(58) Field of Classification Search .............. 118/723 I, 118/723 IR, 723 AN; 156/345.48, 345.49; 315/111.51
See application file for complete search history.

(56) References Cited

U.S. PATENT DOCUMENTS

| | | |
|---|---|---|
| 966,204 A | 8/1910 | Hewitt |
| 4,349,582 A | 9/1982 | Beerwald et al. |
| 4,897,285 A | 1/1990 | Wilhelm |
| 5,223,308 A | 6/1993 | Doehler |
| 5,521,351 A | 5/1996 | Mahoney |
| 6,180,191 B1 | 1/2001 | Felts |
| 6,276,296 B1* | 8/2001 | Plester ............... 118/723 R |
| 6,376,028 B1* | 4/2002 | Laurent et al. ............ 427/571 |
| 2003/0159654 A1 | 8/2003 | Arnold et al. |
| 2005/0003124 A1 | 1/2005 | Beldi et al. |
| 2006/0051539 A1* | 3/2006 | Yamasaki et al. ............ 428/35.7 |

FOREIGN PATENT DOCUMENTS
DE      3908418    *    9/1990

OTHER PUBLICATIONS

R. B. Piejack, V. A. Godyak, and B. M. Alexandrovich in the article entitled "A simple analysis of an inductive RF discharge," Plasma Sources Sci. Technol. 1, 1992, pp. 179 to 186.
R. B. Piejack, V. A. Godyak, and B. M. Alexandrovich "Electrical and Light Characteristics of RF-Inductive Fluorescent Lamps," Journal of the Illuminating Engineering Society, Winter 1994, pp. 40 to 44.

* cited by examiner

*Primary Examiner* — Luz L. Alejandro

(57) ABSTRACT

An antenna assembly for forming a barrier coating on the inner surface of a tube by means of a sealed annular chemical-plasma-reaction chamber defined by the inner wall of the tube, two spaced elements slidingly and sealingly moveable inside the tube, and a quartz tube that interconnects the cylindrical elements. The coating is formed by a PE CVD process generated inside the chamber by a transversal RF antenna unit which creates a plasma column that participates in rotation simultaneously with linear motion thus providing uniform coating of the inner surface of the tube. The method of the invention consists of depositing a layer of silicon dioxide onto the inner surface of a plastic tube by means of the aforementioned antenna assembly. The plasma column is rotated by the RF magnetic field which is rotated by using two RF generators of different frequencies that energize two groups of specifically interconnected coils.

16 Claims, 10 Drawing Sheets

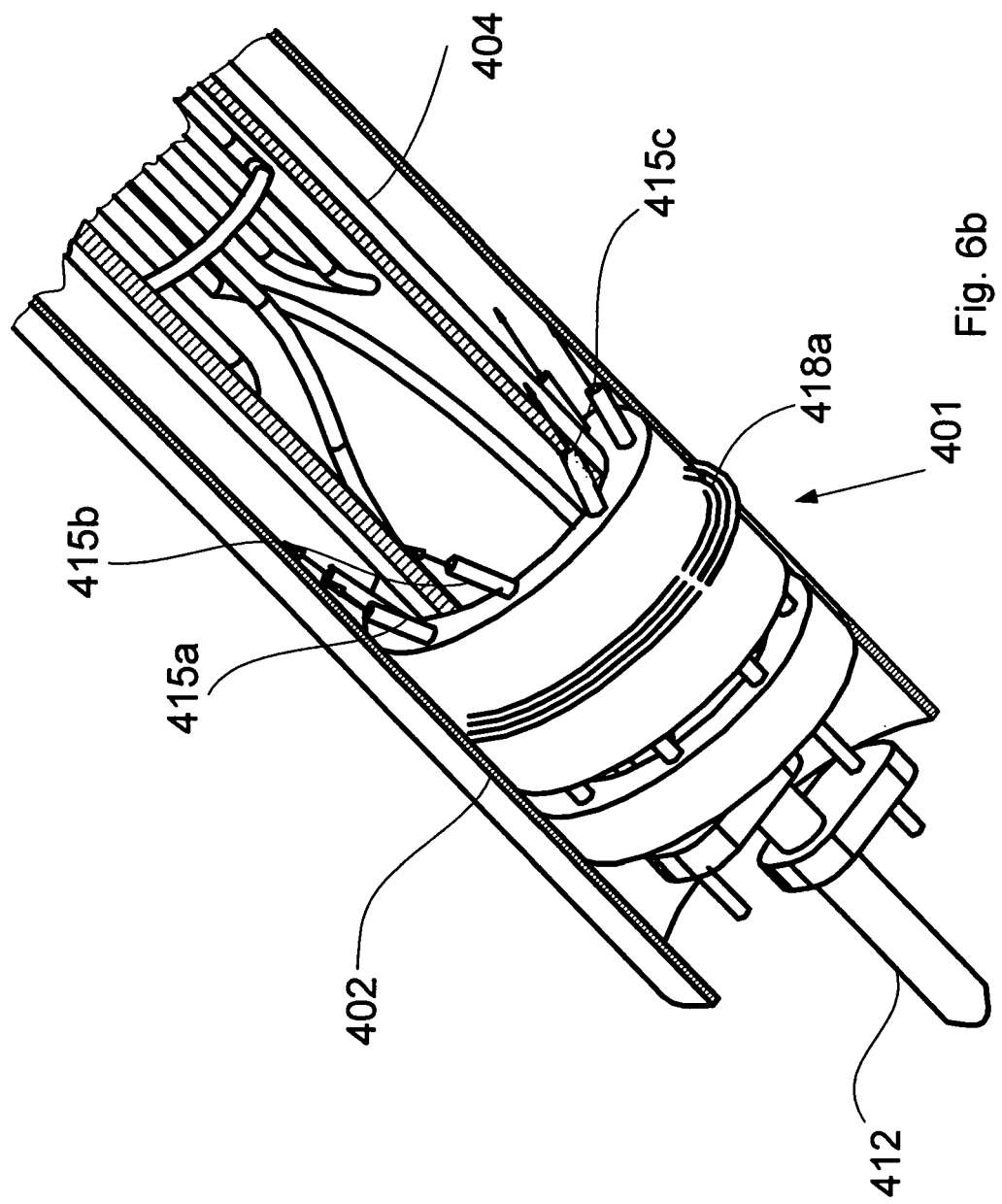

RF ANTENNA ASSEMBLY FOR TREATMENT OF INNER SURFACES OF TUBES WITH INDUCTIVELY COUPLED PLASMA

FIELD OF THE INVENTION

The present invention relates generally to plasma processing and in particular to an RF antenna assembly having an antenna that generates a transversal magnetic field. More specifically, the invention relates to an antenna assembly having an RF antenna with a transversal magnetic field for application of a fluid-impermeable barrier layer onto inner surfaces of non-metal tubes intended for transporting aggressive gaseous or liquid media. The barrier layer is deposited in the form of a thin film by plasma-enhanced chemical vapor deposition (PECVD). In particular, the invention may find use for application of silicon-dioxide coatings onto inner surfaces of plastic tubes used, e.g., in food industry.

BACKGROUND OF THE INVENTION AND DESCRIPTION OF THE PRIOR ART

Methods and devices for coating inner surfaces of tubes are known in the art. For example, coating technology used for tubes employed in oil and gas industry includes methods such as chemical vapor deposition (CVD), physical vapor deposition (PVD), electroplating, flame spray, sol-gel, and polymer lining.

However, all these methods relate to application of anti-corrosive and wear-resistant coatings onto inner surfaces of metal tubes and are not applicable for tubes made from plastic material, in particular, to those plastic tubes which are used in pharmaceutical or food industry. This is because processes for application of coatings onto plastic tubes require low temperature.

An example of an apparatus and method suitable for coating inner surfaces of plastic tubes are disclosed in U.S. Pat. No. 4,897,285 issued in 1990 to R. Wilhelm. This patent describes a microwave plasma apparatus and method for depositing a coating of a prescribed material onto the internal surface of a tube by means of a reaction of a vapor phase providing a prescribed material on the internal surface of a tube. In the aforementioned vapor-phase reaction (a) an atmosphere at a pressure less than atmospheric pressure containing the vapor phase is introduced into the tube, (b) microwave energy is beamed into the tube and is propagated along the length of the tube, (c) a magnetic field is generated in a localized area of the tube in which electron cyclotron resonance occurs for the the frequency of the microwaves, and in which, pressure, field strength of the magnetic field and the power of the high-frequency field are selected so that a low-pressure gas discharge results in the area of the magnetic field to trigger the reaction furnishing the prescribed material, and (d) the magnetic field and thus the plasma are transposed along the length of the tube.

In one particular application, the above method and apparatus are intended for low temperature, plasma assisted, chemical vapor deposition of a thin film coating onto the internal circumferential wall of the elongated tubular member fabricated of a nylon material so as to hermetically seal same from gaseous permeation or other ambient conditions. Nylon tubes which are hermetically sealed with a coating of silicon oxide, silicon nitride, or silicon oxycarbide, or a similar sealing material, are commercially important for the automotive industry and are used in vehicles, e.g., as hydraulic tubes or air conditioning hoses. Such hoses are suitable for transporting liquid coolants that travel therethrough without loss to the atmosphere. However, the scope of application of the method of the aforementioned invention is limited and is applicable only to those tubes which are made from materials permeable to microwave energy.

U.S. Pat. No. 5,223,308 issued in 1993 to J. Doehler discloses a method for the low temperature, microwave enhanced, chemical vacuum deposition of a thin film material onto the surface of a hollow member by creating a sub-atmospheric pressure condition adjacent the surface to be coated while maintaining the applicator through which microwave energy is introduced at substantially atmospheric pressure.

U.S. Pat. No. 4,349,582 issued in 1982 to H. Beerwald, et al. discloses a method for coating the interior of electrically non-conductive tubes by means a reactive deposition of a gas flowing through the pipe, of the type wherein the gas is disassociated by an electric gas discharge and wherein the deposition occurs simultaneously throughout the total pipe length. Pulse discharges are used having pulse lengths which are so adjusted to the transit time of the gas through the tube that the time period between two successive pulses corresponds to the time which is required for filling the tube with unused gas.

Also known in the art is a great number of patents describing application of coating, including PECVD-applied silicon dioxide ($SiO_2$) layers onto inner surfaces of containers, e.g., plastic bottles for storage of beverages.

The PECVD process is described, e.g., by J. Felts in U.S. Pat. No. 6,180,191 issued in 2001. A PECVD-applied silicon dioxide ($SiO_2$) layer on the inside surface of a PET bottle prevents the ingress of oxygen and the egress of carbon dioxide that would affect the taste of the product and its shelf life. After deposition of a thin silicon oxide coating, the oxygen transmission rate is reduced to 0.076 cc/bottle/day.

The PECVD process first deposits a transparent adhesive layer of nanocrystalline SiO and then a colorless silicon oxide ($SiO_x$) barrier layer having a thickness of 0.01 to 0.1 micron. The $SiO_x$ layer improves the oxygen-barrier properties of a bottle more than 10 times, and the $SiO_2$ barrier, specifically, improves this property more than seven times. These barrier improvements remain after hot filling or pasteurization. In addition to the use of PECVD in the food and pharmaceutical industries, application of a PECVD barrier onto the inner surfaces of hollow objects may be used in automotive and piping industries wherein plastic materials such as HDPE are used to replace metals because of their excellent tensile strength and impact properties at temperatures as low as $-50°$ C. and at temperatures as high as $70°$ C., which match the temperature range in fuel tanks and tube lines. Since HDPE is low in weight and cost, it is competitive with steel. However, HDPE has one drawback, and this is permeation of fuels. In order to overcome this drawback, it is necessary to develop an improved barrier coating suitable for application onto the inner surfaces of HDPE tanks and tubes, especially those designed to contain gasoline, alcohol, or other toxic, corrosive, and health-hazardous materials. Moreover, the same coating system is supposed to serve as an inductive probe to provide quality control of the thickness, uniformity, and integrity of the barrier in the inner surface of the wall after the deposition process. The $SiO_2$ coating has high optical transparency and a markedly improved barrier effect as well as greater tensile strength. Silicon dioxide is nontoxic and does not affect the recycling of PET and HDPE.

The inner container coating of $SiO_2$ provides an excellent gas permeation barrier because of two important properties. First, the coating on the interior surface of the container is not subject to abrasion during shipment and handling when compared to the exterior surface of the container. Second, by forming the coating on the interior surface of the container, degradation of the product within the container from direct interactions between the product and the container is prevented.

Thus, there is a demand for a simple, inexpensive, and reliable process for application of barrier coatings onto the inner walls of polymeric containers. The process should have a fast cycle time to accommodate production demands and be suitable for integration into a bottle-molding production line, such as a Husky molding system with throughput of 15,500 bottles per hour. Further, the barrier coating should have good uniformity, and the barrier-coated polymeric container should be easy to recycle.

A plasma-enhanced chemical vapor deposition (PECVD) coating from a gaseous phase is well known and is used in the semiconductor industry to treat semiconductor wafers. However, a flat substrate such as a semiconductor wafer, which is an object of deposition, can be treated at high temperatures with application of a bias voltage, while in the case of plastic containers or tubes, the material of such containers has a low melting point that cannot withstand high temperatures. Plasma discharge is developed by an RF antenna introduced into the container together with a gas mixture and when the RF antenna is energized, this causes a plasma-chemical reaction that results in generation of silicon dioxide, which is deposited onto the inner walls of the containers in the form of a thin barrier layer of $SiO_2$. The plasma-chemical reaction can be conducted between different silicon-containing gases such as silane or disilane and oxygen-containing gases such as nitrogen dioxide, nitrous oxide, etc. Because of the flammability and explosiveness of silanes, the above process requires special, expensive facilities in the semiconductor industry. The food industry prefers to conduct the processes under less expensive, unpretentious conditions with a safer organosilicon or siloxane and by conducting the plasma chemical-reaction with pure oxygen. The plasma-chemical reaction may also have safe-reaction byproducts, such as $CO_2$ and water. Plasma discharge inside a container decomposes siloxane vapor and breaks off methyl groups. Further, the oxygen oxidizes the condensable siloxane backbone (Si—O—Si) resulting from the organosilicon decomposition, thereby forming a thin film of silicon oxide ($SiO_x$) obtained by plasma-enhanced chemical vapor deposition (PECVD) on the interior surface of the container. Gaseous organosilicon is received, for example, from liquid tetraethylorthosilicate (TEOS). TEOS can be converted into vapor by using a direct liquid injection subsystem DL125-C (a product of MKS Company) that includes a vaporizer that evaporates the liquid into vapor for introducing it into the processing system. Byproducts ($CO_2$ and water) are removed by means of a vacuum system through small holes provided in a bottle holder.

The pure $SiO_2$ barrier, however, presents some disadvantages because it is brittle and can be torn during bending and squeezing. In order to enhance durability of the coating, a double-layer coating is preferred wherein the first thin layer is a layer of nanocrystalline $SiO_2$ deposited on the plastic wall. This first layer blocks the porosity of plastic and simultaneously improves adhesion to plastic of the next thick layer of amorphous $SiO_2$ intended for contact with the liquid. This layer increases chemical resistance of the wall to aggressive species and simultaneously reinforces the barrier layer to prevent rupture of the film.

On the other hand, known in the art is ICP discharge, which is used as a source of light and has been used as a source of light for some time. An ICP discharge has been described and analyzed in literature, such as in articles by R. B. Piejack, V. A. Godyak, and B. M. Alexandrovich titled "A simple analysis of an inductive RF discharge," Plasma Sources Sci. Technol. 1, 1992, pages 179 to 186, and "Electrical and Light Characteristics of RF-Inductive Fluorescent Lamps," Journal of the Illuminating Engineering Society, Winter 1994, pages 40 to 44. An ICP light source comprises a vacuum vessel, an inductive coupling system immersed in the vessel, and a high-frequency power source. In the initial stage of operation of inductively coupled plasma, an electrical field (E field) ionizes the fill in the gas-filled volume, and the discharge is initially a characteristic of an E discharge. Once breakdown occurs, however, an abrupt and visible transition to the H discharge occurs. Inductively coupled plasma works on the principal of producing an electric field in a body of gas by means of electromagnetic fields induced by oscillating current in the vicinity of the gas.

When the fields induced in gas are strong enough, the gas can break down and becomes ionized in order to generate plasma. Such plasma has been used for a number of applications ranging from fluorescent lighting to plasma treatment of semiconductor wafers. During operation of an inductively coupled discharge, both E and H discharge components are present, but the applied H discharge component provides greater (usually much greater) power to the plasma than the applied E discharge component.

The inductively coupled plasma has been created by either wrapping a solenoid coil around a glass or quartz tube containing gas ("helical induction") or by placing such a solenoid or spiral within the volume of gas itself ("immersed induction"). In a typical approach, an RLC circuit created by the inductive coil and a matching circuit are tuned to resonance and develop high currents on the coil. An alternating electromagnetic field induced within the gas volume creates a conductive plasma discharge having characteristics similar to secondary winding of a transformer, with a portion of the current through the discharge being converted to light. Lighting devices using immersed induction are described by Hewitt in U.S. Pat. No. 966,204, issued Aug. 2, 1910. Generation of light requires high plasma density in the center of a vessel so that the flat spirals, or solenoids, are immersed in a vacuum bulb having axial symmetry. However, use of axially symmetric antennas is not applicable to elongated containers, e.g., bottles, since they cannot generate plasma having high and uniform density near the inner walls of containers.

An example of use of capacitively coupled plasma for deposition of a barrier coating layer onto inner surfaces of bottles is disclosed in German Patent DE 3,908,418, by H. Grunwald, issued Sep. 20, 1990. This patent describes a system designed for plasma-assisted film deposition or treatment of hollow containers and comprises a capacitively coupled plasma system to drive a low-pressure gas discharge within the form. Such a system also has disadvantages, including a potentially lower deposition and treatment rate for mass-produced applications. Similar to other capacitively coupled plasma systems, the system of the aforementioned invention uses high plasma sheath energies that may result in excess heating of sensitive plastic container walls resulting in container damage. This design is also complicated and may require expensive and regular maintenance caused by film deposition on power-coupling components.

Also known in the art is the use of apparatus for coating the inner walls of containers, such as bottles, by means of deposition from inductively coupled plasma (see, e.g., U.S. Pat. No. 5,521,351 issued in 1996 to L. Mahoney). This invention relates to inductively coupled plasma generated within the interior of a hollow form held within a vacuum chamber enclosure by using a radio frequency coil mounted within the vacuum chamber around the outer surface of the container and closely conforming to the shape of the hollow container. The interior of a hollow form having complex shapes can be treated using two or more coils arranged to treat distinct portions of the form, and the shape of the coils and the manner in which power is supplied to the coils can be selected to control spatial distribution of the plasma within the hollow form.

A main drawback of all apparatuses and methods for application of coatings onto the inner surfaces of containers known to the inventor is a non-optimal direction of the magnetic fields generated by the antenna coils. RF power applied to these coils provides RF current that generates an axial magnetic field. Therefore, plasma density in such systems is distributed so that maximum plasma density is concentrated in the vicinity of the axis but minimum plasma density is close to the inner wall of the container, when the antenna is used for plasma-enhanced chemical vapor deposition of a barrier layer onto the inner walls of the aforementioned container. Coating of the walls in such a system has a low throughput rate. In other words, the existing antennas of apparatus for treating inner surfaces of containers have a geometry that does not produce plasma fields that match the inner profiles of containers.

In order to overcome the drawbacks inherent in RF antennas with an axial magnetic field, the inventor herein developed a new and unique transversal RF antenna that generates a magnetic field normal to the axial direction of the RF antenna and hence normal to the inner walls of the container into which the RF antenna is inserted. The apparatus and method of the aforementioned invention are described in pending U.S. patent application Ser. No. 12/152,064 filed by the same applicant on May 12, 2008. According to the above invention, an antenna assembly consists of a holder which supports a transversal RF antenna with a plurality of multi-turn coils connected in series or in parallel and intended for generation of an inductively coupled plasma discharge inside a container with high plasma density in vicinity of the container's inner walls. The aforementioned discharge is used for inducing in the container a plasma chemical reaction between oxygen and organosilane with resulting deposition of the reaction product in the form of silicon dioxide onto the inner walls of the container for forming a fluid-impermeable barrier layer. A specific feature of the antenna is that it generates a magnetic field transversal to the longitudinal axis of the antenna, i.e., normal to the container's walls, where a maximal electric field, maximal plasma density and, correspondingly, maximal rate of deposition of silicon dioxide on the wall are achieved.

However, the antenna assembly of the aforementioned invention is intended for application of barrier layers onto inner surfaces of containers and is not directly applicable for application of protective layers onto inner surface of elongated tubes. This is because a container has a bottom and can be easily sealed prior to generation of vacuum by an antenna holder. Furthermore, the volume of the container is small and the antenna inserted into the container has essentially the same length as the container itself so that treatment can be carried out over the entire length with deposition of the layer on the entire surface of the container at once, which cannot be done efficiently and with high uniformity of coating inside a long tube or tube.

OBJECTS AND SUMMARY OF THE INVENTION

It is an object of the present invention to provide an antenna assembly with an RF antenna that generates a transverse magnetic field perpendicular to the longitudinal axis of the antenna for generation of inductively coupled plasma inside a plastic tube for forming a thin coating film impermeable to fluids and having high wear-resistant and corrosion-resistant properties. It is another object to provide an antenna assembly of the aforementioned type, which is suitable for use in a PECVD process. It is a further object to provide the aforementioned antenna assembly wherein the antenna is provided with a rotating magnetic field. It is a further object to provide the aforementioned antenna assembly, which is suitable for application of one or more layers of silicone dioxide coatings onto the inner surfaces of hollow containers at relatively low temperatures, with high-speed rate of deposition and with possibility of controlling the deposition process. It is a further object to provide the aforementioned antenna assembly which creates a localized and sealed plasma-reaction chamber inside the tube wherein treatment is carried out as in an evacuated closed container with continuous movement of the aforementioned sealed plasma-reaction chamber along the tube and with rotation of the plasma discharge around the longitudinal axis of the tube.

The antenna assembly of the invention consists essentially of a plurality of transversal antennas the amount of which may be six or more for uniformity of coating. The antennas are supported by a holder, which is made in the form of a disk slidingly fitted inside a tube to be treated. The side of the antenna assembly opposite to the holder is formed by plug in the form of another disk, which is also slidingly fitted inside the tube. The holder and the plug are rigidly interconnected by means of a cylindrical quartz tube, which has an outer diameter smaller than the inner diameter of the tube so that an annular gap is formed between the tubes. Thus, the holder and the plug form a certain closed space within a section of the tube, and due to the sliding interaction between the outer surfaces of the holder and plug and the inner surface of the tube, the pressure in the closed space formed by the annular gap may be essentially different from the pressure inside the quartz tube and outside the tube. Openings are formed in central parts of the holder and the plug, respectively, for the supply of cooling air into the interior of the quartz tube for cooling antenna windings, while openings formed in the peripheral areas of the holder and the plug are used for the supply of the precursor and for exhaust of by-products into and from the annular space, respectively.

When the antennas are energized and the precursor gas is supplied into the annular space, plasma discharge is generated in the annular space, which initiates a plasma-chemical reaction, and the product of the reaction is deposited onto the inner wall of the tube. For example, if the precursor is a mixture of oxygen with gaseous siloxane, the product of the reaction will be silicon dioxide that will cover the inner surface of the tube with a protective layer having a thickness sufficient for protecting the interior of the tube from penetration by substances contained in the tube material as well as for preventing leakage of the medium transported through the tube to the outside through the tube wall. This is especially important when the tubes to be treated are made from plastic and are intended for use in the food or pharmaceutical industries.

In other words, the antenna assembly of the invention is provided with means for arranging the plasma column near the inner walls of the tube and for rotating the plasma column during the deposition process simultaneously with movement in the axial direction of the tube along with the linear movement of the antenna assembly of the invention and with generation of RF currents having different frequencies.

This new means and method are based on dividing the multi-coil transversal antenna into two antenna groups and feeding them separately by the RF currents from two separate RF generators that operate on different frequencies. In such a system, plasma serves as a mixer of frequencies and generates plasma currents of beat frequencies that produce in the antenna an angular vector shift. A couple of oppositely arranged coils having the same direction of the RF current in one antenna group can be connected in series or in parallel with another couple of the coils of the same antenna group and both antennas of the couple can be arranged in the alternating order with the coils of the second antenna group connected to the second generator.

Distance d between neighboring turns of the spiral coil is related with a breakdown voltage $V_B$ as:

$$V_B = Apd/\ln(pd) + B,$$

where p is pressure in the volume into which the antenna is immersed, pd is the Paschen minimum, and A and B are constants, depending on geometry of the antenna.

In certain embodiments, input of the first winding and output of the last winding are connected to the terminals of the matching network that is connected to the RF generator.

BRIEF DESCRIPTION OF THE DRAWINGS

FIG. 6b is a view similar to FIG. 6a illustrating direction of the small precursor-supply tubes directed towards the inner surface of the tube for cooling the area of deposition.

DETAILED DESCRIPTION OF THE INVENTION

Figure 1:
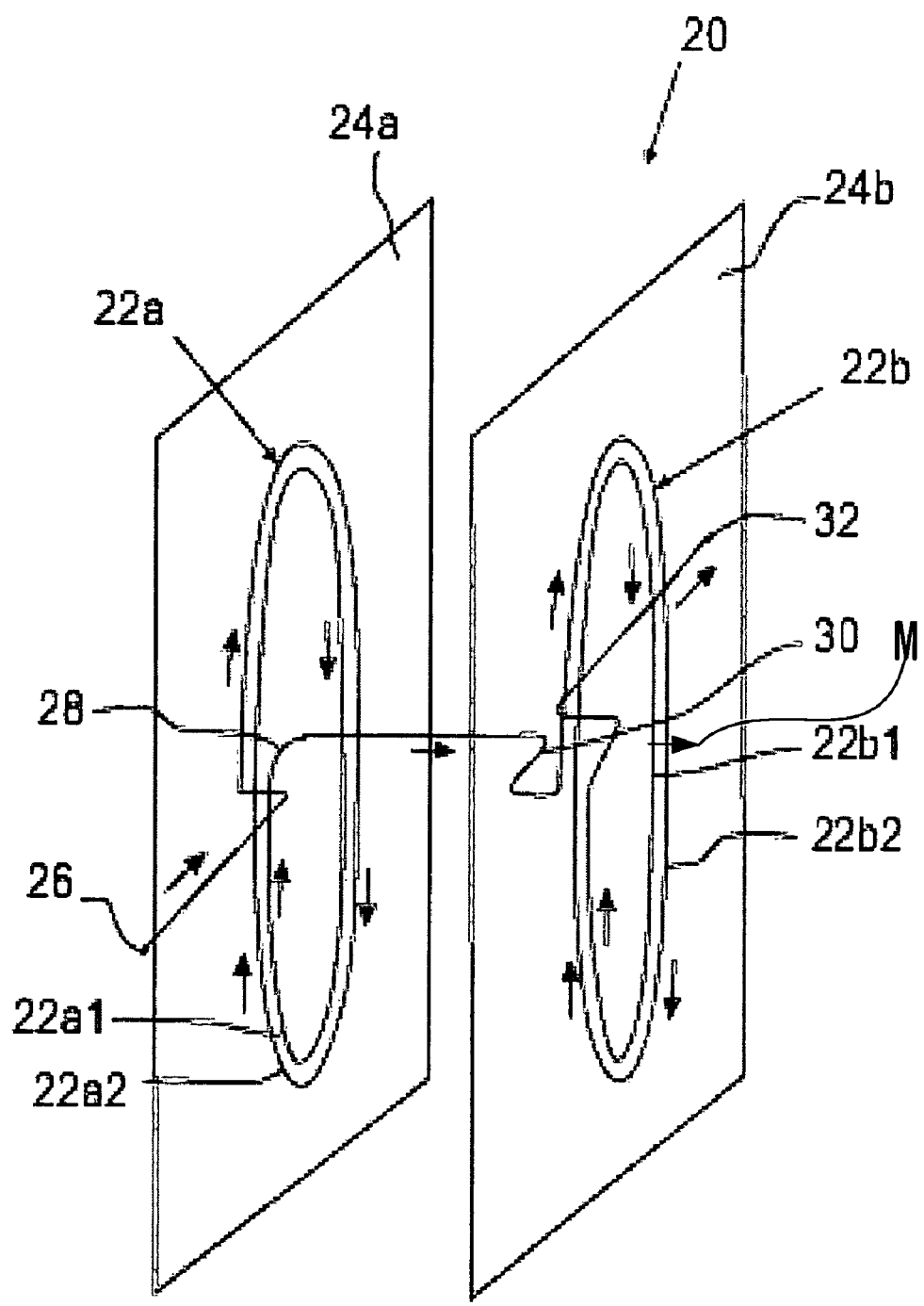
FIG. 1 is a three-dimensional view of the ICP transversal antenna of the invention.

An example of an antenna assembly of the invention for application of a protective coating onto the inner surface of a tube by means of a PECVD process will now be described with reference to the accompanying drawings.

Since the transversal RF antenna is the heart of the invention, let us first consider this antenna in more detail.

The inventor herein has found that in contradiction with the generally accepted erroneous viewpoint that the magnetic field of a solenoid has maximum strength on the longitudinal axis thereof, in reality the strength of the magnetic field on the longitudinal axis of the solenoid is minimal, while the main part of the lines of the magnetic flux is concentrated near the inner area solenoid winding. In order to check this statement it is sufficient to consider a magnetic field of a circular turn through which a current flows and then to summarize (integrate) the result over the solenoid length. Contrary to this, an electric field generated in plasma surrounded by a solenoid has its maximum in the center of the solenoid and has its minimum in the vicinity of the solenoid's winding. Density of plasma has the same distribution pattern. Therefore, in the past the design with the maximum axial brightness was chosen as a plasma-based source of light. However, such a design where density is maximal in the center of the container and minimal near the inner walls thereof is disadvantageous for application of barrier layers onto the inner surfaces of containers. In the latter case, the speed of deposition of the coating material will also be minimal.

The present invention is based on the above finding made by the inventor.

The transversal antenna assembly of the invention is intended for generation of inductively coupled plasma (ICP) in sealed and evacuated space. The term "transversal" includes an antenna with saddle-like coils wherein all turns of the antenna winding are formed by wrapping a wire around a cylindrical mandrel that has a diameter less than the diameter of the container's mouth, if the mouth is round. For a cylindrical mandrel, the turns of each saddle-like coil may have an angular, elliptical, oval, rectangular, tapered, or nontapered configuration, depending on the configuration of the hollow container. The turns inherit the same bending radii as the mandrel. Taking into account the fact that the antenna is immersed into the gaseous volume, all turns are separated from each other to prevent high-voltage breakdown between neighboring turns.

One may express the relation between breakdown voltage $V_B$ and distance d between turns as:

$$V_B = Apd/\ln(pd) + B, \tag{1}$$

where p is pressure in the volume where the antenna is immersed, d is critical distance, pd is the Paschen minimum, and A and B are constants, depending on geometry of the antenna.

Each next turn has an increased width and height increased, as compared with the central turn. The determination "transversal" includes an antenna with solenoid-like coils, wherein the turns are formed by wrapping the wire around several azimuthally arranged mandrels, which are joined to the central axial mandrel of the constitutive fixture. In this case, the turns have the same geometry but are separated in the radial (relative to the axis of the mouth) direction with clearance that is large enough to prevent high-voltage breakdown between neighboring turns. The determination "transversal" also includes an antenna with coils wherein the turns are wrapped as a solenoid with a radially increased size. Each turn can be larger in the radial direction to the wall of the hollow container in order to fill out the total space of the hollow container by the wire, especially of the container without a neck, in order to develop a plasma column in the vicinity of the inner surface of the container inside the narrow space between the inner surface of the container and the front turns of the solenoids.

Also, the radius of curvature of an outward turn of each solenoid is increased as compared with the inward turn. In this case, high uniformity of coating and high rate of deposition can be provided with relatively low RF power.

The geometry of each turn of each spiral coil can be different. In a two-dimensional projection, it can be rectangular, tapered rectangular, elliptical, or oval, with the plane of symmetry coincident with the axis of the mouth of the hollow container and normal to the inner surface of the container. In the axial projection, the spiral coils are distributed angularly and uniformly with increments of 180/n, where n=1. 2. 3 . . . m.

The transversal antenna is comprised of multiturn coils connected in series or in parallel. The coils can be spiral coils or solenoids azimuthally distributed relative to the axis of the mouth of the hollow container through which the antenna is immersed into the hollow container.

Each turn is made from a copper wire or a copper tube for passing cooling medium, and an outward turn of each coil is bent with a radius of curvature equal to or less than the inner radius of the tube.

Although the transversal antenna immersed in a tube generates the same ICP discharges as the axial solenoid immersed in the RF light bulb, distribution of plasma density in these discharges is different because of the different direction of magnetic flux induced by such antennas. The magnetic flux of the axial solenoid antenna is directed along the longitudinal axis of the bulb and transforms the high electric current into plasma oriented in the direction of this longitudinal axis. Accelerated electrons have higher ionization efficiency. They create higher plasma density along the axis and in the vicinity of the bottom of the bulb in order to produce high axial brightness of the plasma. The transversal antenna of the invention directs the electromagnetic field toward the inner wall of the tube. Because of this direction, electromagnetic fields of the several angularly distributed coils are transformed into plasma by high current in the vicinity of the inner surface of the tube. The higher is the ionization efficiency and the greater is the electron density near the inner surface of tube, the higher is the rate of the deposition of $SiO_2$ from plasma, and the higher is the intensity of the chemical reaction between organosilane and oxygen.

Simultaneously with deposition, the plasma heats the interior surface of the tube, and this, to some limit, increases density of the deposited coating and enhances barrier properties thereof. The duration of the deposition must be very short; otherwise, the plastic can be softened, even molten, and the tube can collapse. The outward turn approaches the inner surface of the tube within a reasonable limit.

The azimuthally distributed coils provide uniformity of such deposition. The transversal antenna comprises an even number of sets of windings that can be connected in series or in parallel. In any case, the direction of the electromagnetic fields of the opposite coils is supposed to be the same; otherwise, the total electromagnetic field would be weakened, plasma density would be reduced, coating would be nonuniform, and impedance of the antenna and reflected RF power would be increased. The angular increment of the azimuthally distributed coils is supposed to equal 180/n, where n=1, 2, 3, . . . m. It is understandable that the higher the n, the more uniform the thickness of the deposited thin film.

A three-dimensional view of a transversal RF antenna 20 of the invention is shown in FIG. 1. Since the ICP transversal inductive antenna 20 has a three-dimensional configuration, positions of some parts of the antenna 20 will be considered with reference to an orthogonal XYZ coordinate system, as shown schematically in FIG. 1.

In the embodiment shown in FIG. 1, the saddle-like version of the transversal antenna has a winding 22 that consists of two parts, i.e., an ICP transversal antenna winding part 22a arranged as a separate coil substantially in a first XZ plane 24a and an ICP transversal antenna winding part 22b, which is arranged as another separate coil in a second XZ plane 24b. Input of the first coil and output of the second coil arrangements are connected to an RF power supply (not shown) that provides RF current flowing in the same direction in both coils. Such an arrangement allows the total magnetic flux, produced by both coils, to be increased. This total magnetic flux, which is shown by arrow M in FIG. 1, is transversal relative to the axis of the mouth of the container and normal to the walls of this container (shown and described below, e.g., a bottle 422 shown in FIG. 7). The total magnetic flux transforms the electrical field in plasma that is close to the walls. It is understood that in the embodiment shown in FIG. 1, the planes 24a and 24b and, hence, the winding parts 22a and 22b, are shown schematically as flat. It is understood that they are being wrapped on a lateral surface of the mandrel and, in reality, inherit a radius of curvature equal to or less than the radius of curvature of the mouth of the container. It is also understood that the turns need not be arranged on a flat plane along curvilinear profiles, such as cylindrical or taped cylindrical profiles, which, depending on the radius of curvature can be equal to or less than the radius of the container's mouth. It is understood that the turns can be circular, rectangular, rectangular tapered, elliptical, oval, or of another shape. In this case, each next turn will have an inner area larger than the previous area, and the distance between the neighboring turns must exceed one critical from the viewpoint of high potential breakdown between the neighboring turns.

The first antenna winding part 22a may have two or more bent turns that may have different configurations and dimensions selected in compliance with the specific object and object profile to be treated. For example, configuration of the turns may be rectangular, rectangular tapered, circular, elliptical, or oval. In the specific embodiments shown in FIG. 1 for the purposes of example only, the antenna winding part 22a has a spiral shape that consists of a small oval-shaped turn 22a1 and a large oval-shaped turn 22a2. It is understood that the oval shape of the turns is shown only as an example and that the turns 22a1 and 22a2 may have a round, rectangular, tapered, or nontapered configuration.

An input terminal 26 of the large oval-shaped turn 22a2 of the first antenna winding part 22a is connected through a matching network (not shown in FIG. 1) to the first terminal of an RF power source (not shown in FIG. 1), while an output terminal 28 of the first antenna winding part 22a is connected to an input terminal 30 of the second winding part 22b. An output terminal 32 of the second winding part 22b is connected through the matching network to the second terminal of an RF power source (not shown in FIG. 1). It is understood that the entire circuit from the input terminal 26 of the first winding part 22a to the output terminal 32 of the second winding part 22b is continuous and has a series connection. Arrows show direction of the current that provides the electromagnetic field in each winding part with the same direction.

Figure 2:
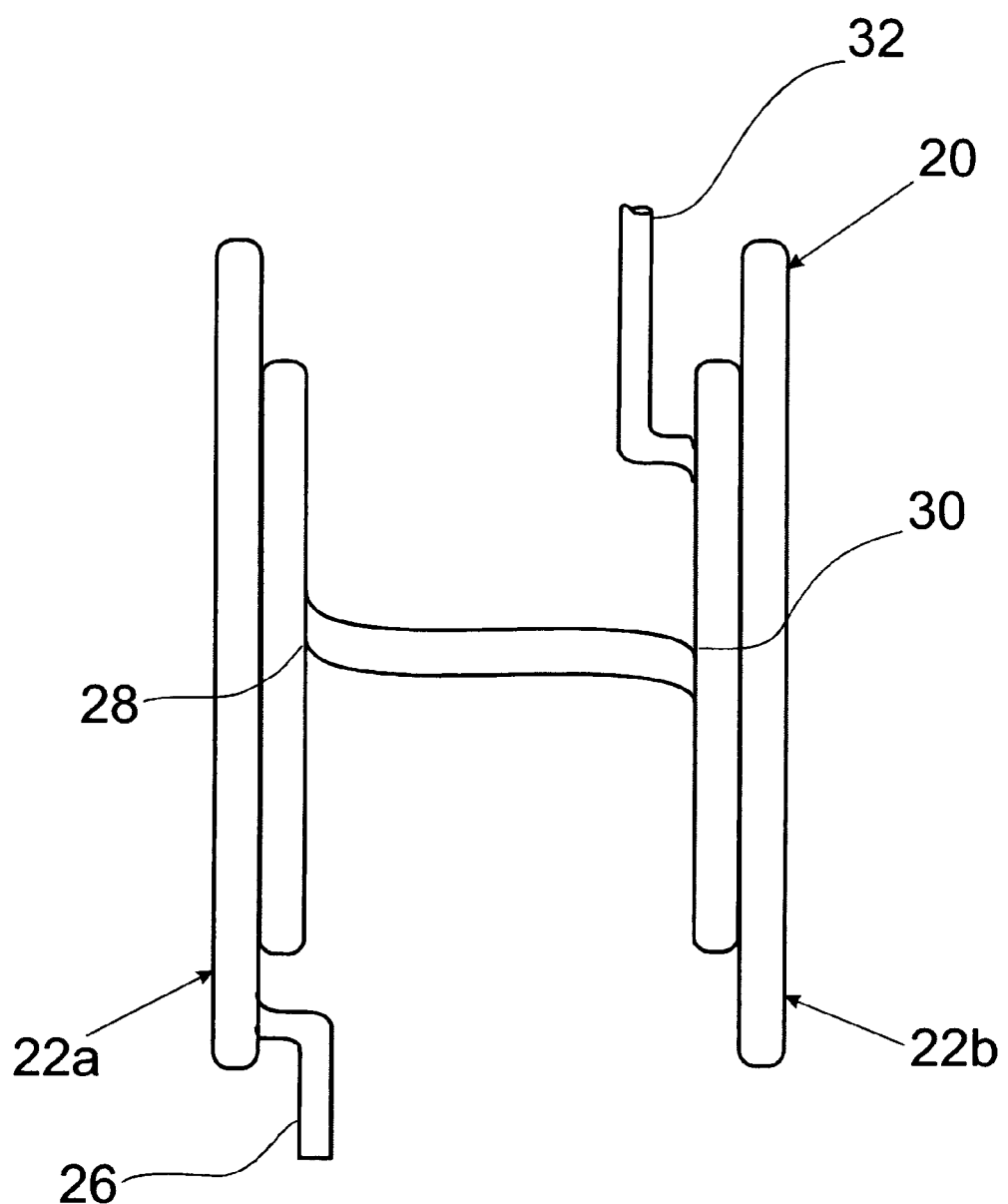
FIG. 2 is a top view of the ICP transversal antenna of FIG. 1, the antenna being composed of spiral coil parts arranged in flat planes.
Figure 3:
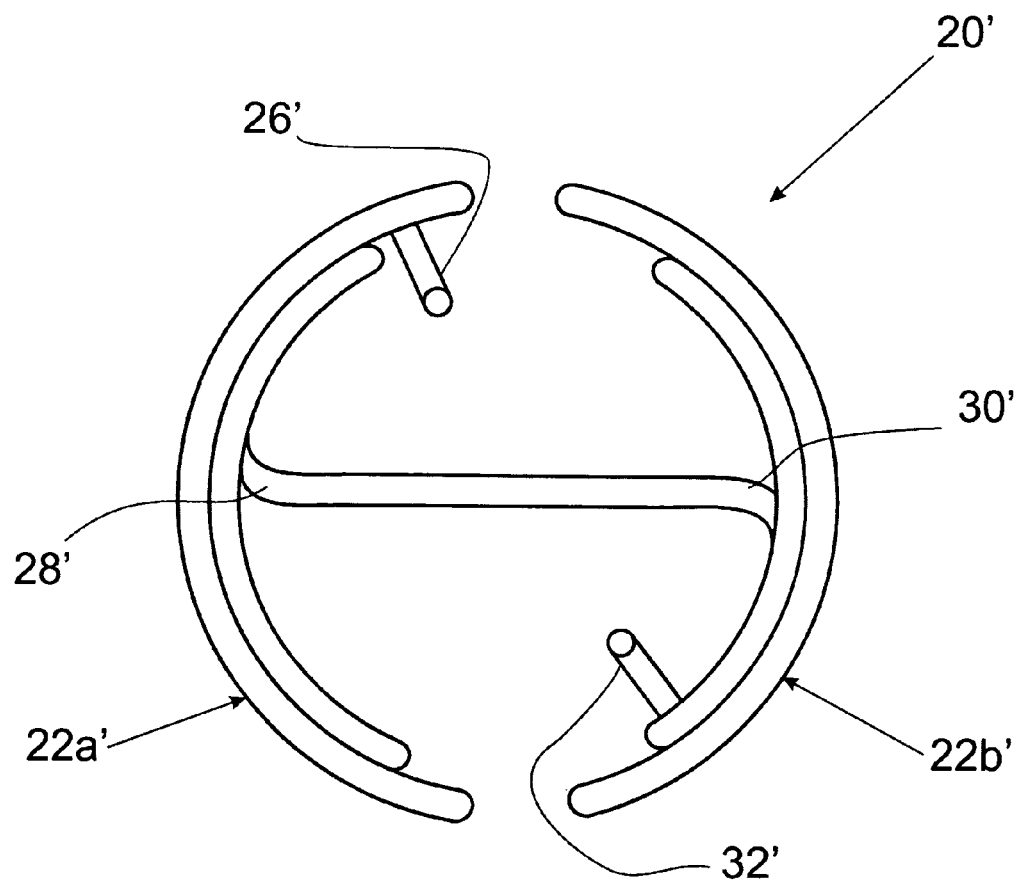
FIG. 3 is a view similar to FIG. 2 but for the transversal antenna composed of spiral coil parts which in a top view have curvilinear or saddle-like profiles.

FIG. 2 shows a top view of the transversal RF antenna 20. It can be seen from FIG. 2 that in the embodiment of the antenna 20 shown in FIG. 2, the first and second antenna winding parts 22a and 22b are located in mirror positions in parallel planes and therefore have flat configurations. However, the antenna winding parts 22a and 22b may also have curvilinear configurations inherited from the curvilinear configuration of the mandrel (not shown in FIG. 2) onto which they are wrapped according to the radius of curvature of the mouth of the container or according to the radius of curvature of the curvilinear inner surface of the open container. This is shown in FIG. 3, which is a top view of the antenna similar to one shown in FIG. 2 and is designated by reference numeral 20'. Parts of the antennas shown in FIG. 3, similar to those of the antenna 20 in FIGS. 1 and 2, are designated by the same reference numerals but with the addition of a prime. For example, in the antenna 20', the input terminal of the large oval-shaped turn of the first antenna winding part 22a' is designated by reference numeral 26', and so forth.

In according with this invention, the antenna assembly for application of protective coatings onto inner surfaces of the tubes moves relative to a stationary tube to be treated or the tube is moved relative to the stationary antenna unit for forming a movable plasma column inside a section of the tube. This plasma section defines a sealed working space inside the tube where the transversal RF antenna generates plasma and where a plasma chemical reaction occurs in the aforementioned sealed working space which is preliminarily evacuated and filled with a precursor gas under a given pressure.

In another aspect, in order to enhance uniformity of deposition of the barrier layer onto the inner wall of a tube, the resulting magnetic field created by the antenna coils is rotated around the longitudinal axis of the tube which coincides with the longitudinal axis of the antenna assembly. For this purpose, the antenna coils are connected to the RF generators of different frequencies. Two currents circulated in the coils generate magnetic fields that, in turn, generate plasma currents that function as coils with secondary RF currents having beating frequencies and following the magnetic fields with rotating vectors, as a result of which the plasma column is rotated.

Figure 4A:
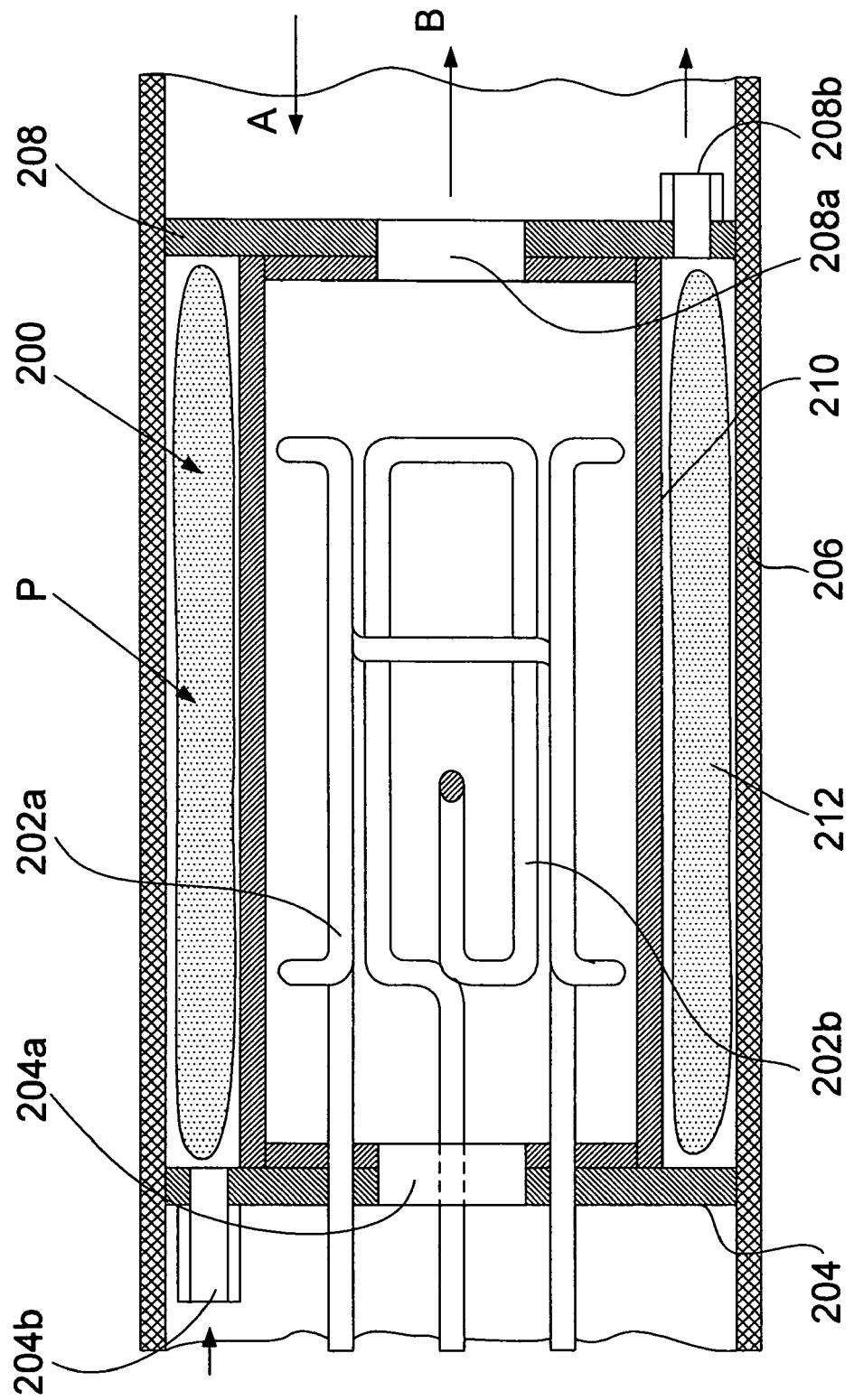
FIG. 4a is a longitudinal sectional view of the antenna assembly of the invention for treating inner surfaces of the tubes shown in a simplified form.

A simplified view of the antenna assembly 200 of the invention for treating inner surfaces of the tubes is shown in a longitudinal sectional view in FIG. 4a. As can be seen from this drawing the antenna assembly 200 consists of a plurality of individual transversal antennas, only two of which, i.e., transversal RF antenna 202a and 202b, are shown in FIG. 4a for simplicity of the drawings. Each antenna 202a and 202b is the same as one disclosed with reference to FIGS. 1 to 3. It is understood that for uniformity of treatment the number of antennas should exceed two and that six or more antennas can be incorporated into the device of the invention. The antennas 202a and 20b are supported by a first supporting element, hereinafter referred to as a holder 204, which is made in the form of a disk slidingly fitted inside the tube 206 to be treated. The side of the antenna assembly 200 opposite to the holder 204 is closed with a second supporting element, hereinafter referred to as a plug 208 in the form of another disk, which is also slidingly fitted inside the tube 206. The holder and the disk 208 are rigidly interconnected by means of a spacer, hereinafter referred to as a cylindrical quartz tube 210 which has an outer diameter smaller than the inner diameter of the tube 206 so that an annular gap 212 is formed between the tubes. Thus, the holder 204 and the plug 208 form a certain closed space within a section of the tube 206, and due to the sliding interaction between the outer surfaces of the holder 204 and plug 208 and the inner surface of the tube 206, the pressure in the closed space formed by the annular gap 212 may be essentially different from the pressure inside the quartz tube 210 and outside the tube 206. Openings 204a and 208a are formed in central parts of the holder 204 and the plug 208, respectively, for the supply of cooling air into the interior of the quartz tube 210 for cooling antenna windings, while openings 204b and 208b formed in the peripheral areas of the holder 204 and the plug 208 are used for the supply of the precursor and exhaust of by-products into and from the annular space 212, respectively.

When the antennas 202a and 202b are energized and the precursor gas is supplied into the annular space 212, plasma discharge P is generated in the annular space 212, which initiates a plasma-chemical reaction, and the product of the reaction is deposited onto the inner wall of the tube 206. For example, if the precursor is a mixture of oxygen with gaseous siloxane, the product of the reaction will be silicon dioxide that will cover the inner surface of the tube 206 with a protective layer having a thickness sufficient for protecting the interior of the tube from penetration by substances contained in the tube material as well as for preventing leakage of the medium transported through the tube to the outside through the tube wall. This is especially important when the tubes to be treated are made from plastic and are intended for use in the food or pharmaceutical industry.

It is understood that the process of deposition occurs with continuous movement of the antenna assembly along the tube or after treating a certain section of the tube 206, and the antenna assembly 202 can be shifted to the next working position in the direction of arrow A (FIG. 4a) where the plug 208 assumes the position of the holder 204 shown in FIG. 4a, and then the operation is repeated.

In practice, however, the continuous process is preferable so that the entire unit 200 is continuously moved in the direction of arrow A (FIG. 4a) with a speed that is selected with reference to the rate of deposition and other operation conditions. As will be described later, this continuous linear movement is combined with rotation of the plasma discharge. Combination of the axial movement with rotation of the plasma discharge provides uniformity of coating.

The products of the reaction and the waste cooling air are constantly removed from the working space 212 and the interior of the quartz tube 210, respectively.

Figure 4B:
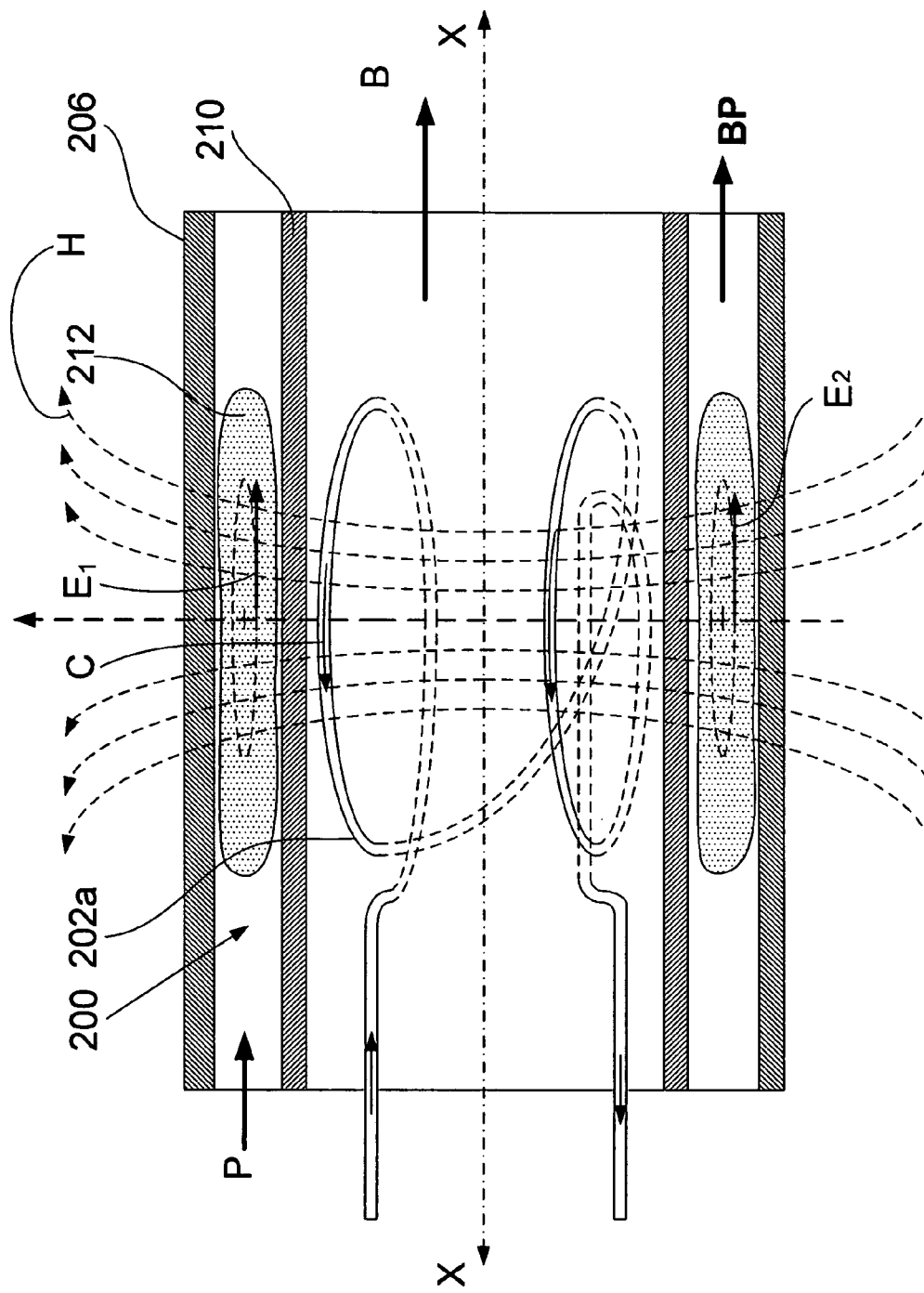
FIG. 4b is a longitudinal sectional view illustrating locations and directions of electrical and magnetic RF fields generated in the sectional of the tube during operation of the transversal RF antenna of the invention.

Directions and locations of electrical and magnetic RF fields generated in the sectional of the tube 206 during operation of the transversal RF antenna 200 are shown in FIG. 4b. For simplicity of the drawing, the pattern is shown only for the RF antenna 202a. Lines of forces of the magnetic field, which are designated by letter H, will assume positions shown in FIG. 4b when the direction of the RF current coincides with the direction shown by arrow C. In this case, the magnetic field H will generate an electric field E in the space 212. Topology of the RF antenna 202a is such that at opposite ends of antenna 202a the directions of the electric fields E1 and E2 (see FIG. 4b) coincide. These electric fields generate plasma discharge P in the annular space 212. In FIG. 4b, arrow P shows direction of precursor supplied to the tube, and arrow BP shows direction of by-products removed from the tube.

The second RF antenna 202b (FIG. 4a), which is arranged in a plane different from the plan of the antenna 202a, has the same behavior pattern. Thus, each antenna generates in the annular space 212 a plasma discharge localized near the walls of the tube 206.

The greater the number of the individual antennas, such as antennas 202a and 202b, the more uniform plasma and plasma density is obtained. However, much higher uniformity can be achieved by providing means for rotation of the resulting magnetic field around the longitudinal axis X-X (FIG. 4b) of the tube 206.

Figure 5:
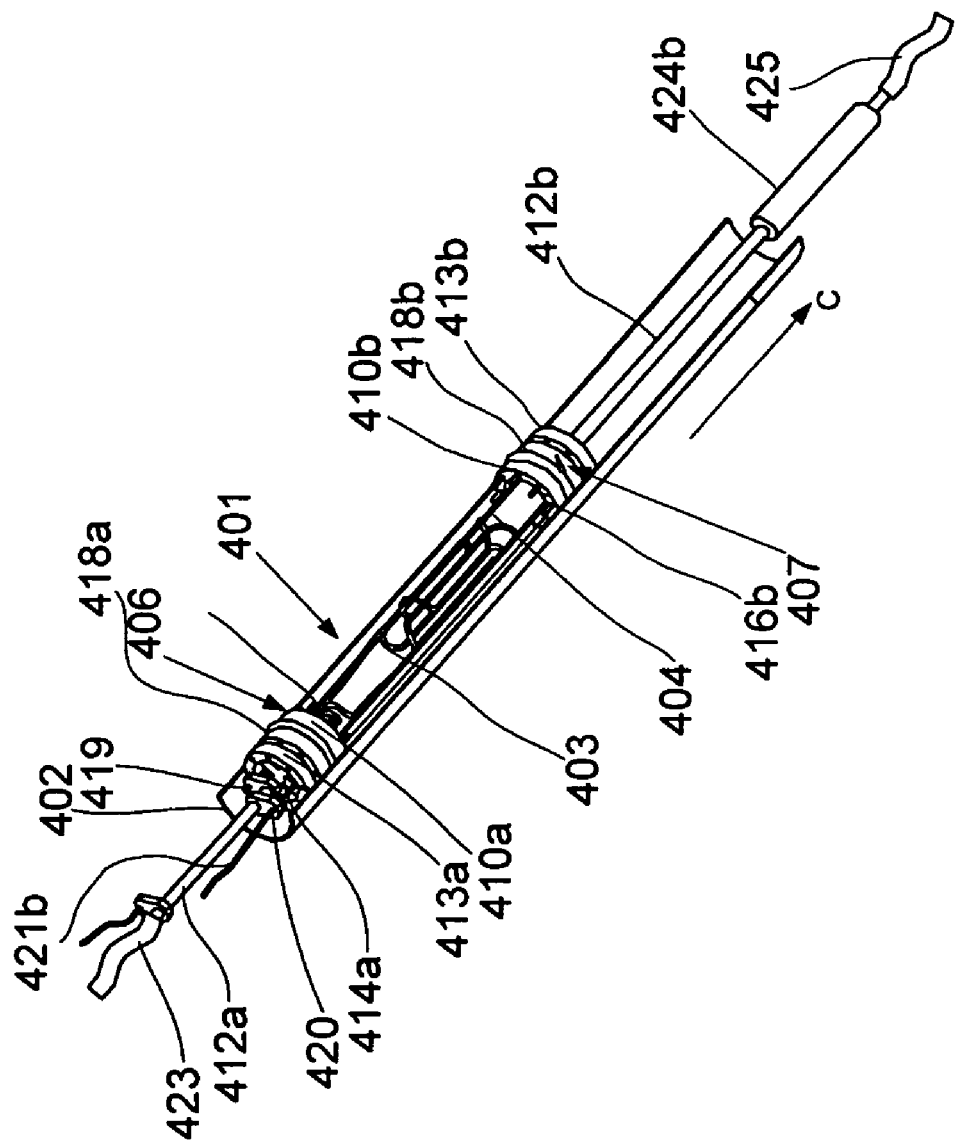
FIG. 5 is a three-dimensional view illustrating the device of the invention inside a tube to be treated with a part of the tube removed for exposing the device.
Figure 6A:
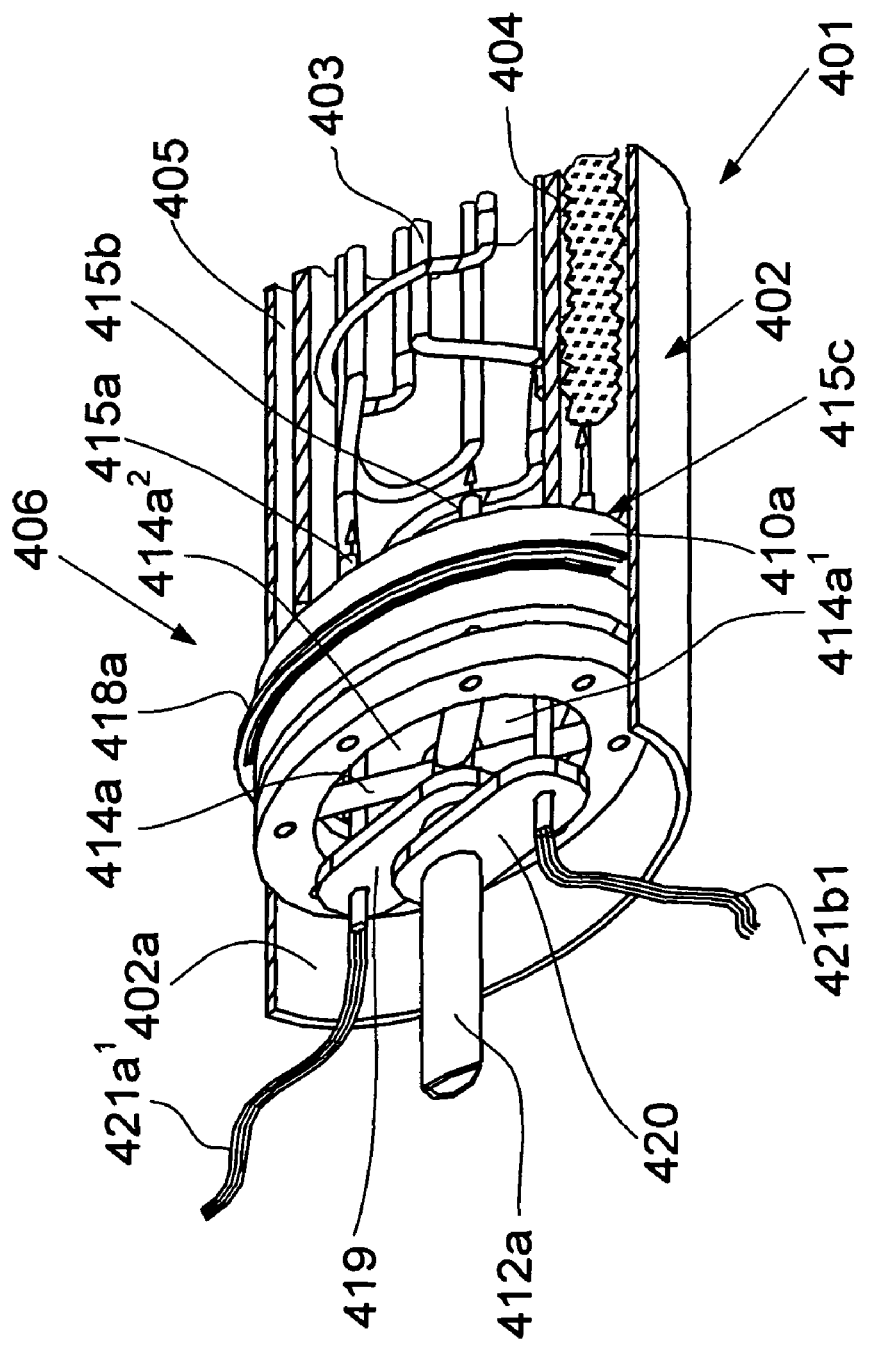
FIG. 6a is a fragmental three-dimensional view shown on a larger scale than FIG. 5 and illustrating details of the parts associated with the antenna holder.

An example of a device made in accordance with one embodiment of the present invention is shown in FIG. 5, which is a three-dimensional view of the antenna assembly of the invention in a working position inside a tube, and FIG. 6a is a fragmental three-dimensional view shown on a larger scale than FIG. 5 and illustrating details of the parts associated with the antenna holder.

In the example shown in FIG. 5, an RF antenna assembly 401 is used for depositing a protective layer (not shown) onto inner surface of a long plastic tube 402. Such a coating protects a medium that is contained in the tube or is transported through the tube from leaking to the outside through the tube walls. Such a feature is especially important for tubes used in chemical, pharmaceutical, or food industry. The coatings may also improve resistance against corrosion that may be caused by aggressive gases, liquids, or hard inclusions contained in the liquids flowing through the tubes.

The RF antenna assembly 401 contains a transversal antenna unit 403 which is supposed to be driven inside of the tube 402 from one end of the tube 402 to the other end and to generate during such a movement a moving plasma column in order to provide deposition of the barrier or protective layer on the entire inner surface 402a of the tube 402.

A speed of the linear movement of the plasma column and a rate of deposition of the barrier layer are optimized to preserve the inner surface of the tube from long exposure to the heat flux irradiated by the moving plasma column. It is advantageous to expose the antenna assembly 401 to a plasma discharge for as short time as possible. Otherwise there is a risk that the antenna assembly itself will be deposited with the same deposition material, e.g., silicon dioxide, as the inner surface of the tube 402a. Such a contamination can change impedance of the antenna and affect the discharge stability. In order to solve the above problem, the antenna assembly 401 is provided with a quartz tube 405 that contains the transversal RF antenna unit 403 and that is inserted into the plastic tube 402 with a certain annular gap 404 between the outer wall of the quartz tube 404 and the inner surface 402a of the plastic tube 402 to be treated. The quartz tube 405 isolates the antenna from RF discharge generated by the RF antenna unit 403.

Furthermore, during operation the RF antenna unit 403 of the antenna assembly 401 can be cooled by air that may be pumped through the interior of the quartz tube 404 while the gap 405 can be filled with precursor gas which is needed for the formation of a silicon dioxide coating on the inner surface 402a of the plastic tube 402 by the PECVD process.

Figure 7A:
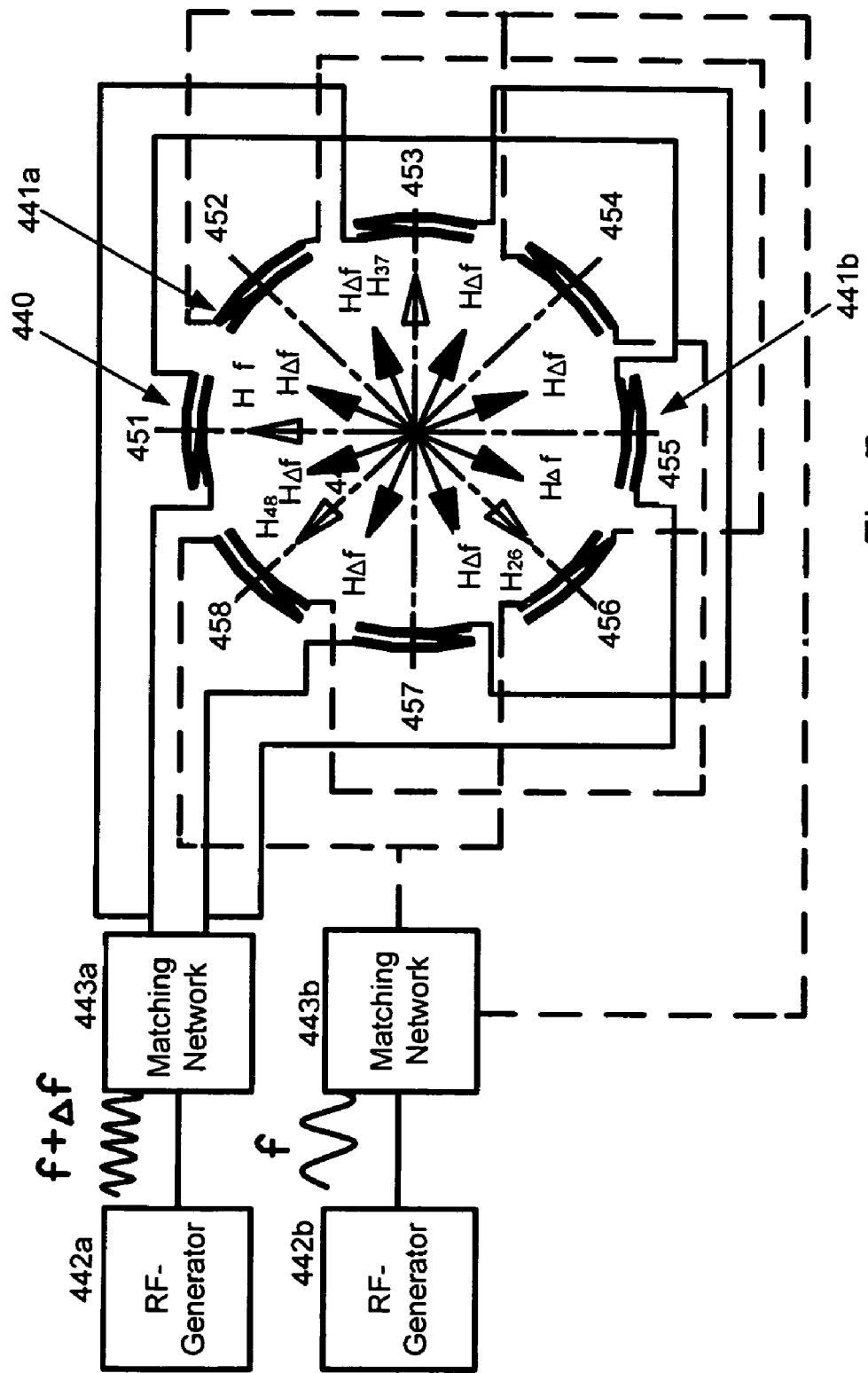
FIG. 7a is a diagram illustrating interconnection of coils in two groups of antennas and their connection to RF generators through respective matching units.
Figure 7B:
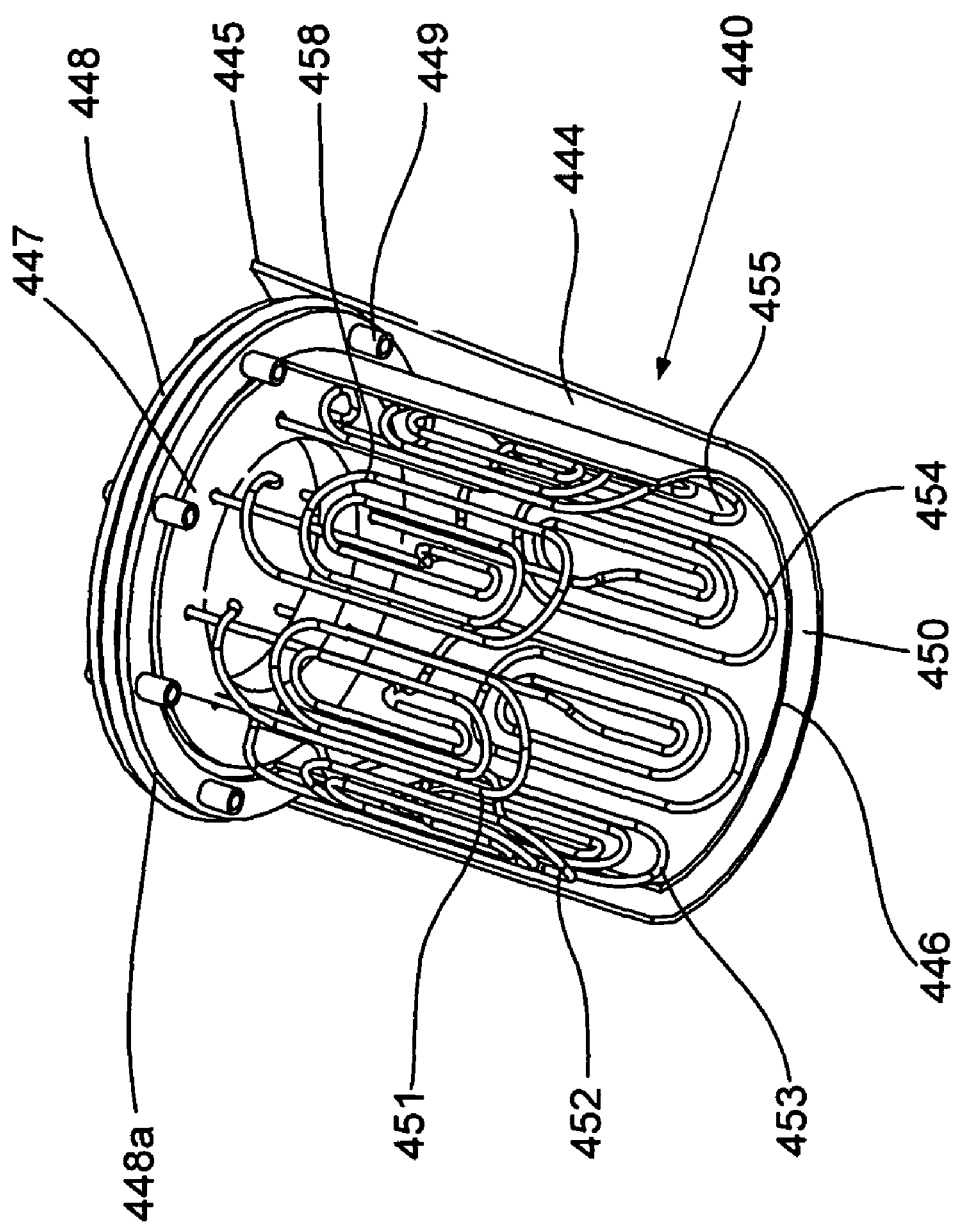
FIG. 7b is a three-dimensional view of an antenna assembly of the invention with eight individual antennas.

Plasma is generated by this antenna in the volume of the gap 405 between the tube 402 and the inner quartz tube 404. The aforementioned gap 405 is limited by an antenna holder 406 (FIGS. 5 and 6) and a plug 407 (FIG. 5), which are arranged on opposite sides of the antenna unit 403 (the second, or other antennas are not shown, although it is assumed that the assembly 401 contains several angularly shifted RF antennas, as it is shown in FIG. 7a which is a diagram illustrating interconnection of coils in two groups of antennas and their connection to RF generators through respective matching units. FIG. 7b is a three-dimensional view of an antenna assembly of the invention with eight individual antennas.

The holder 406 and the plug 407 are provided with openings for the supply and exhaust of the precursor and the cooling air of the type illustrated by openings 204a, 208a, and 204b, 208b in FIG. 4a. Precursor gas is delivered to the holder-side of the space 405 from a gas tube 412a (FIGS. 5 and 6) through a manifold 413a which is used for uniformity of precursor gas supply. Similarly, precursor gas is delivered to the plug-side of the space 405 from a gas tube 412b (FIG. 6a) through a manifold 413b. As shown in FIG. 6a, the gas tube 412a is connected to the manifold 413a through a tubular cross 414a. A similar tubular cross (not shown) may be is provided on the opposite side of the device.

On one hand, the tubular cross 414a allows the uniform filling of the manifolds with the precursor gas, and on the other hand, the tube cross does not obstruct admission of the air flow into the interior of the quartz tube 404 for cooling the antennas. Furthermore, openings 414a1, 414a2, etc., between the crossed bars of the tubular cross 414a are large enough for guiding the cables, such as electric cables 421a1 and 421b1 of the RF power source (not shown in FIGS. 5 and 6) to high voltage terminals (such as terminals 26 and 32 in FIG. 3) with a clearance sufficient to prevent voltage breakdown.

Each doughnut-shaped manifold 413a or 413b is provided by a plurality of short small-diameter gas guiding tubes 415a, 415b, 415c, etc., which are shown and designated only on the holder side in FIGS. 6a and 6b but have a similar arrangement on the plug side as well. These tubes pass through a ceramic ring 410a (FIG. 6a) on the holder side (and through a ceramic ring 410b on the plug side) from the openings of the manifolds for immersion into the gap 405 between the inner surface 402a of the tube 402 and the outer surface of the quartz tube 405. As it can be seen from FIG. 6b, which is a fragmental view of a holder-side of the antenna assembly of the invention, the gas guiding tubes 415a, 415b, 415c, etc. are inclined with respect to the longitudinal axis of the tube towards the inner wall 402a of the tube in order to direct the flow of precursor gas directly onto the tube wall for cooling the latter. This is because during the plasma-chemical reaction the inner wall 402a of the tube 402 is heated to a high temperature, and in order to provide smooth and unobstructed sliding movement of the holder 406 and the plug 407 along the inner surface of the tube 402 without violation of sealing conditions, the inner surface of the tube has to be cooled.

More specifically, the small tubes 415a, 415b, 415c, etc., from the holder side deliver the precursor gas into the gap 405, while the tubes, such as tube 416b (only one of which is designated in the plug side for simplification of FIG. 5) are used for evacuating air from the space of the gap 405 prior to the PECVD process, as well as for the removal of byproducts of the plasma chemical reaction during PECVD process.

The quartz tube 404 is rigidly connected on one side to the holder 406 and on the other side to the plug 407, e.g., by inserting the ends of the quart tube into recesses on the facing sides of the holder and the plug with a press fit, or the like (not shown). Thus, the quartz tube 404, the antenna holder 406, and the plug 407, and the RF antennas are combined into the antenna assembly 401 (FIGS. 5 and 6) of the present invention and can be moved as a single unit.

Both ceramic rings 410a and 410b of the antenna holder 406 and plug 407 are provided with seal rings 418a and 418b, respectively, placed into annular grooves formed on the outer peripheries of these rings. The seal rings 418a and 418b allow sliding of the antenna assembly 401 inside the tube 402 being treated and at the same time seal the interior of the space in the gap 405 where vacuum is maintained during movement of the entire assembly 401 along the tube 402.

The grounded end of the antenna unit 403 is attached to the grounded terminal through the electric cable 421a1, and the high voltage end is connected to the RF generator through the matching device (not shown in FIGS. 5 and 6) via the cable 421b1. The connecting ends of the respective cables 421a1 and 421b1 (FIG. 6) are held by the gas tube 412a with the use of ceramic plates 419 and 420, but the main function of this tube, which is connected to a flexible hose 423 (FIG. 6a) is supply of precursor gas to the space of the gap 405 from a stationary precursor supply system (not shown). The precursor gas may be a mixture of organosilane like TEOS with oxygen.

The antenna assembly 401 is moved along the tube 402, e.g., by means of a linear actuator 424 (FIG. 5) attached to the gas tube 412b on the plug side of the assembly 401. The tube 412b communicates with a vacuum pump (not shown) through a flexible hose 425.

In order to create a thin barrier layer of silicon dioxide on the entire inner surface of the plastic tube 402 in a continuous PECVD process, the antenna assembly 440 with a plurality of circumferentially arranged antennas of the type shown in FIG. 7b is continuously moved inside the tube 402 with a speed selected in accordance with specific operation conditions while the plasma-chemical reaction is carried out in the low-pressure space of the gap 405 with activation of the antenna and supply of the precursor gas into the aforementioned space, along with rotation of the magnetic field by the system described later and shown in FIG. 7a.

More specifically, the process of deposition of the barrier layer of silicon dioxide onto the inner surface 402a (FIG. 6) of the tube 402 consists of the following operations, which occur simultaneously:

1. The linear actuator 422 moves the antenna assembly 401 with all the parts between the holder 406 and the plug 407, e.g., in the direction shown by arrow C in FIG. 5, inside the tube 402.

2. During the above movement, air is evacuated from the space of the annular gap 405 through the small tubes on the plug side of the assembly through the manifold where these tubes are connected to the tubular cross (similar to one designated by reference numeral 414a and shown on the holder side of the device in FIG. 6) that provides communication between the manifold 413b and the gas supply tube 412b and, finally, through the flexible hose 425 (FIG. 5) connected to the vacuum pump (not shown).

3. The space of the gap 405 is filled with a mixture of gaseous organosilane with oxygen, the gaseous mixture enters the manifold, and then impinged onto the inner surface of the 402a of the tube 402 through inclined small-diameter tubes 415a, 415b, 415c, etc. (FIG. 6b).

4. The RF current from the RF generator (not shown) is delivered to the antenna unit 403 trough the matching device (not shown In FIGS. 5 and 6), cable 423, high voltage terminal, flows through the moving transversal antenna unit 403, and leaves the antenna to the ground through the grounding cable 421b1.

5. The RF current that flows through the antenna's coils with the plane of symmetry normal to the wall of the tube 402 generates magnetic fields directed to the inner wall 402a of the tube, and generates electrical fields, which, in turn, creates a high-density plasma discharge in space of the gap 405 in vicinity of the inner wall of the tube. During the process, this plasma discharge moves along the wall together with the antenna assembly 401.

6. The plasma generated in the gap 405, in turn, generates heat that decomposes the organosiloxane and breaks off the methyl groups of the siloxane. It also decomposes oxygen $O_2$ into atomic oxygen that oxidizes methyl and any other organic groups. Further, the oxygen oxidizes the condensable siloxane backbone (Si—O—Si), resulting from the TEOS decomposition to form a barrier layer of silicon oxide ($SiO_x$) on the interior surface 402a of the tube 402.

7. Byproducts of the plasma chemical reaction such as $CO_2$ and water are pumped out by means of a pump (not shown) through the plurality of the small tubes, such as the tube 416b, the ends of which are inserted into the gap 405 through the doughnut-shaped manifold 413b and the ceramic ring 410b of the plug 407 and inclined toward the inner surface of the tube.

8. As a result, the plasma chemical reaction causes deposition of a continuous barrier layer (not shown) of silicon dioxide that is formed on the inner surface 402a of the tube 402 at a relatively low temperature of the aforementioned inner surface controlled by the speed of the linear movement of the antenna assembly 401 driven from the actuator 424.

It is understood that in order to provide uniform coating and to overlap the space between neighboring coils where plasma density is low, a tube of a large diameter with a large inner surface requests a plurality of coils. However, increase in the number of coils increases the total impedance of the antenna to the extent that is may not be afforded by the matching device.

In the present invention the above problem is solved by a method that allows overlapping of the inner surface of the tube with an antenna having a limited number of coils, and this is achieved by employing the so-called Rotamak confinement system with a rotating magnetic field, and, hence, with a rotating plasma column.

The scheme of the Rotamak is described, e.g., by J. Reece Roth in "Industrial Plasma Engineering" Vol. 1, Principles Institute of Physics Publishing Bristol and Philadelphia 200, page 414, P. M.

According to the Rotamak scheme, a rotating magnetic field is generated by a set of coils and energized by two RF generators operating at different phases with the same frequency. This phased excitation of the coils carrying alternating current analogous to the coils of a polyphase induction motor produces a rotating magnetic induction. Because the coils are arranged around the axis of an open solenoidal magnetic containment field, the rotational axis of the rotating magnetic field is parallel to the solenoidal magnetic containment field axis. Electrical eddy currents are induced in the plasma and rotate in synchronism with the rotating magnetic field but at an angular phase lag. The rotating magnetic field attracts the magnetic field, formed by the phase-shifted eddy currents, applies torque to the plasma charge carriers of the eddy currents, and causes them to rotate as a ring around the solenoidal magnetic containment field axis.

The drawback of the Rotamak method of the rotation of the plasma column is a phase distortion by the matching networks of a phase lag between two RF generators, leading to generation of the magnetic fields with the uncontrolled vector and value and, as a result, to the non-uniform distribution of the plasma density near walls and to non-uniform coating. Another drawback is necessity of using an additional magnetic system to generate the outer magnetic field.

Taking in account the fact that this magnetic system is also supposed to be moved together with the antenna holder in the axial direction, the Rotamak method is not applicable for coating the inner surfaces of tubes.

In other words, the antenna assembly 401 of the invention is provided with means for arranging the plasma column near the inner walls of the tube and for rotating the plasma column during the deposition process simultaneously with movement in the axial direction of the tube along with the linear movement of the antenna assembly of the invention and with generation of RF currents having different frequencies. IN other words, plasma currents of beat frequencies are generated that produce in the antenna an angular vector shift.

This new means and method are based on dividing the multi-coil transversal antenna into two antenna groups and feeding them separately by the RF currents from two separate RF generators. In such a system, plasma serves as a mixer of frequencies and generates plasma currents of beat frequencies that produce in the antenna an angular vector shift. The coils of each group are arranged in pairs of diametrically opposite coils having the same direction of currents, and coil pairs of each group are connected in series or in parallel with each other and with the respective RF generator through a respective matching network. The coil pairs of one group are arranged in alternating manner with the coil pairs of another group.

Schematics of the multi-coil transversal antenna assembly of the invention for deposition of the barrier layer onto the inner walls of the plastic hollow articles, especially tube of a large diameter, are shown in FIG. 7a.

As shown in FIG. 7a, the multi-coil antenna 440 is divided into two antenna groups 441a and 441b that are energized from two separate RF generators 442a and 442b that operates on different frequencies f and (f+Δf) through matching networks 443a and 443b, respectively. If a couple of oppositely arranged coils having the same direction of the RF currents in one antenna group is connected in series or in parallel with another couple of coils of the same group, the antennas of both groups have to be arranged in an alternating order with the couples of opposite arranged coils of another group. For example, each coil pair 451, 453, 455, and 457 of the first group 441a consists of a pair of diametrically opposite coils having the same direction of RF current, and these coil pairs are connected in parallel to each other and to the first RF generator 442a through the matching network 443a. However, each coil pair 452, 454, 456, and 458 of the second group 442b consists of a pair of diametrically opposite coils having the same direction of RF current, and these coil pairs are connected in parallel to each other and to the second RF generator 442b through the matching network 443b. If the difference in frequencies of each generator doesn't exceed 10% of the mean frequency, plasma can be assumed as a mixer of the two RF powers. The plasma generates currents with beat frequencies as the secondary winding of the plasma transformer develops the coupled RF current in the coils. This current with the beat frequency generates the magnetic fields with the rotatable vector overlapping the space between the coils. Such an antenna creates and maintains a plasma current loop near the inner wall of the tube wherein the plasma is rotated by magnetic fields $H\Omega_E$ and $H\Omega_F$ that, in turn, rotate about the antenna's axis. Such an effect can be explained by using simple equations.

The RF current $I_{RF1}$ in the coils 451, 453, 415, 417 of the first portion 441a of the multi-coil transversal antenna 440 connected to the first RF generator 442a generates two mutually ortogonal magnetic fields $H_{15}$ and $H_{37}$ in the plasma that transforms into the electric field $$E_1 = E_{10} \cos(w_1 t + \varnothing) \tag{1}$$

The RF current $I_{RF2}$ in the coils 412, 414, 416, and 418 distributed between the coils of the first portion 441a and connected to the RF generator 442b generates two mutually orthogonal magnetic fields $H_{26}$ and $H_{48}$ in the plasma that transforms into the electric field $$E_2 = E_{20} \cos w_2 t. \tag{2}$$

The total current in plasma can be expressed as follows:

$$I \sim (E_1 + E_2)^2 \tag{3}$$

$$I \sim [E_1 \cos(w_1 t + \varnothing) + E_2 \cos w_2 t]^2 \tag{4}$$

$$I \sim E_1^2 \cos^2(w_1 t + \varnothing) + 2E_1 E_2 \cos(w_1 t + \varnothing) \cdot \cos w_2 t + E_2^2 \cos^2 w_2 t \tag{5}$$

$$I \sim \tfrac{1}{2} E_1^2 [1 + \cos 2(w_1 t + \varnothing)] + E_1 E_2 [\cos \{(w_1 - w_2)t +\} + \cos \{(w_1 + w_2)t + \varnothing)\}] + \tfrac{1}{2} E_2^2 [1 + \cos 2 w_2 t]. \tag{6}$$

The total current in plasma includes two additional components $$I_1 \sim E_1 E_2 \cos \{(w_1 - w_2)t + \varnothing\} \tag{7}$$

and $$I_2 \sim E_1 E_2 \cos \{(w_1 + w_2)t + \varnothing\} \tag{8}$$

where $(w_1 - w_2)$ is the difference (beat) frequency $\Omega$ and $(w_1 + w_2)$ is the sum frequency $\Omega$.

These plasma currents transform in each antenna groups into the secondary currents $I\Omega_{RF}$ and $I\Omega_{RF}$ with a phase lag that provides angular shift of the vectors of the original currents $I_{RF1}$ and $I_{RF2}$. Finally, the magnetic fields $H_{\Omega E} H_{\Omega E}$ with rotatable vectors are generated. The rotating magnetic fields attract the magnetic field formed by the phase-shifted plasma currents and applies torque to the plasma charge carriers of the plasma currents thus causing them to rotate as a ring near the inner wall of the tube. The rotating plasma current loop formed and sustained by the induced RF currents $I\Omega_{RF}$ and $I\Omega_{RF}$ provides plasma density that overlaps spaces between the coils and promotes formation of a uniform barrier coating.

FIG. 7b is a three-dimensional view that illustrates an embodiment of an antenna assembly 440 of the invention with a multi-coil transversal antenna for deposition of a barrier coating of silicon dioxide onto the inner surface 444 of a large diameter tube 445. The antenna assembly consists of eight coils 451, 452, 453, 454, 455, 456, 457, and 458 divided into two groups 441a and 441b (FIG. 7a). The antenna assembly is inserted into a quartz tube 446 secured in an antenna holder 448. The antenna holder 448 also supports a plurality of gas supplying tubes 449, which feed gaseous precursor to an annular plasma chamber 450 formed between the outer surface of the quartz tube 446 and the inner surface of the tube 445 being treated. The opposite end of the quartz tube 446 is secured to a plug (which is not shown in FIG. 7b and which is similar to the plug 407 of FIG. 7a). The antenna holder 448 is provided with a seal ring 448a, which together with a seal ring of the plug (not shown) seals the plasma chamber 450 during movement of the antenna assembly 440 inside the tube 445 in the course of the barrier coating process.

The antenna assembly with two RF currents circulated in the groups of alternatingly positioned coils generates and sustains a plasma current loop (not shown) in the annular plasma volume 450. This plasma loop is concentrated near the inner wall of the tube 445, and the plasma of this loop is rotated by magnetic fields $H_{\Omega E}$ and $H_{\Omega F}$, which, in turn, rotateng about antenna axis. Along with rotation, the plasma loop moves in the axial direction of the tube. A combined rotary and axial movement of the plasma discharge provides uniform deposition of a silicon dioxide layer onto the total inner surface of the tube 445.

Thus, it has been shown that the invention provides an antenna assembly with an RF antenna that generates a transverse magnetic field perpendicular to the longitudinal axis of the antenna for generation of inductively coupled plasma inside a plastic tube for forming a thin coating film impermeable to fluids and having high wear-resistant and corrosion-resistant properties. The antenna assembly of the aforementioned type is suitable for use in a PECVD process. The antenna assembly is provided with a rotating magnetic field and is suitable for application of one or more layers of silicone dioxide coatings onto the inner surfaces of hollow containers at relatively low temperatures, with high-speed rate of deposition and with possibility of controlling the deposition process.

The aforementioned antenna assembly creates a localized and sealed plasma-reaction chamber inside the tube wherein treatment is carried out as in an evacuated closed container with continuous movement of the aforementioned sealed plasma-reaction chamber along the tube and with rotation of the plasma discharge around the longitudinal axis of the tube.

Although the invention is shown and described with reference to specific embodiments, it is understood that these embodiments should not be construed as limiting the areas of application of the invention and that any changes and modifications are possible, provided these changes and modifications do not depart from the scope of the attached patent claims. For example, the transversal antenna windings may have shapes different from those shown in the drawings, and the winding of the antenna may consist of coils different in number from eight and having different dimensions and configurations. The tube may be moved relative to a stationary antenna assembly or both the antenna assembly and the tube can be toward each other. The actuator that moves the antenna assembly relative to the tube may be comprised of a linear actuator in the form of a stepper motor, a pneumatic drive, electric drive, or a hydraulic drive.

What we claim is:

1. An antenna assembly for treatment of an inner surface of a tube with the use of inductively coupled plasma and by means of a chemical plasma reaction comprising:
   a first supporting element which has outer dimensions slidingly fitted into the tube to be treated;
   a second supporting element spaced from the first supporting element and having outer dimensions slidingly fitted into the tube to be treated;
   a spacer between the first supporting element and the second supporting element that rigidly interconnects the first and second supporting elements and has outer dimensions smaller than the outer dimensions of the first and second supporting elements for forming a gap with the tube when the antenna assembly is inserted into the tube, the spacer being made from a material penetrable to RF energy;
   a transversal RF antenna unit supported by the first supporting element and inserted into the spacer, the antenna unit having means for generating a transversal magnetic field penetrable through the spacer into the gap between the spacer and the tube when the antenna assembly is inserted into the tube for treatment of the inner surface of the tube;
   an RF generator unit connected to the transversal antenna unit for supply of RF energy to the transversal antenna unit;
   means for supply of a precursor gas into the gap through the first supporting element; and
   means for evacuation of products of the plasma reaction through the second supporting element.

2. The antenna assembly of claim 1, wherein the antenna assembly is intended for treating cylindrical tubes, the first supporting element is a cylindrical holder, the second supporting element is a cylindrical plug, the cylindrical holder and the cylindrical plug having outer surfaces sealingly fitted into the tube to be treated, and the spacer comprising a cylindrical quartz tube.

3. The antenna assembly of claim 2, further comprising means for rotating the transversal magnetic field.

4. The antenna assembly of claim 2, wherein the means for rotating the transversal magnetic field comprises the transversal antenna unit in combination with at least two RF generators operating at different frequencies, wherein the transversal antenna unit comprises a plurality of antenna coils divided into at least two antenna groups, each antenna group is connected to a respective RF generator of the two RF generators, the coils of each group are arranged in pairs of diametrically opposite coils having the same direction of currents, wherein coil pairs of each group are connected in series or in parallel with each other and with the respective RF generator, the coil pairs of one group are arranged in alternating manner with the coil pairs of another group; and a respective matching unit is connected between each respective RF generator and the respective group of coils.

5. The antenna assembly of claim 4, further comprising electric cables that connect the RF generators with the coils, the tubular cross having openings, said cables being guided to the coils through the openings of the tubular cross.

6. The antenna assembly of claim 2, wherein the means for supply of a precursor gas into the gap comprises: a gas manifold that comprises a hollow doughnut-shaped body supported by the holder and having a plurality of openings into the gap; a precursor gas supply tube; and a tubular cross inside the manifold that connects the precursor gas supply tube with the gas manifold.

7. The antenna assembly of claim 6, further provided with inclined tubes that are connected to the openings of the gas manifold and extend into the gap at an angle to the inner surface of the tube and towards the inner surface of the tube for cooling the inner surface of the tube during treatment by the flow of the precursor gas.

8. The antenna assembly of claim 2, wherein the tube is a plastic tube.

9. The antenna assembly of claim 1, wherein the antenna unit is intended for generation of inductively coupled plasma that causes a plasma chemical reaction in the gaseous precursor in the gap and wherein the treatment of inner surfaces of tubes is deposition of products of said reaction onto the inner surface of the tube by means of a plasma-enhanced chemical vapor deposition.

10. The antenna assembly of claim 9, further comprising means for rotating the transversal magnetic field.

11. The antenna assembly of claim 10, wherein the means for rotating the transversal magnetic field comprises RF generator unit that comprises the transversal antenna unit in combination with at least two RF generators operating at different frequencies for generating plasma that serves as a mixer of frequencies and generates plasma currents of beat frequencies that produce in the antenna an angular vector shift, wherein the antenna unit comprises a plurality of antenna coils divided into at least two antenna groups, each antenna group is connected to a respective RF generator of the two RF generators, the coils of each group are arranged in pairs having the same direction of currents, coil pairs of each group are connected in series or in parallel with each other and with the respective RF generator, the coil pairs of one group are arranged in alternating manner with the coil pairs of another group; and a respective matching unit is connected between each respective RF generator and the respective group of coils.

12. The antenna assembly of claim 11, wherein the means for supply of a precursor gas into the gap comprises: a gas manifold that comprises a hollow doughnut-shaped body supported by the holder and having a plurality of openings into the gap: a precursor gas supply tube; and a tubular cross inside the manifold that connects the precursor gas supply tube with the gas manifold.

13. The antenna assembly of claim 12, further provided with inclined tubes that are connected to the openings of the gas manifold and extend into the gap at an angle to the inner surface of the tube and towards the inner surface of the tube for cooling the inner surface of the tube during treatment by the flow of the precursor gas.

14. The antenna assembly of claim 1, further provided with a linear actuator that is connected to the antenna assembly and moves the antenna assembly relative to the tube being treated.

15. The antenna assembly of claim 14, further comprising means for rotating the transversal magnetic field simultaneously with movement inside the tube by means of the linear actuator.

16. The antenna assembly of claim 15, wherein the means for rotating the transversal magnetic field comprises RF generator unit that comprises the transversal antenna unit in combination with at least two RF generators operating at different frequencies, wherein the antenna unit comprises a plurality of antenna coils divided into at least two antenna groups, each antenna group is connected to a respective RF generator of the two RF generators, the coils of each group are arranged in pairs having the same direction of currents, coil pairs of each group are connected in series or in parallel with each other and with the respective RF generator, the coil pairs of one group are arranged in alternating manner with the coil pairs of another group; and a respective matching unit is connected between each respective RF generator and the respective group of coils, the plasma generated in the gap functioning as a mixer of frequencies and generates plasma currents of beat frequencies that produce in the antenna an angular vector shift.

\* \* \* \* \*